Sept. 18, 1951 J. L. HOELLERICH 2,568,630

TUNING KNOB

Filed Nov. 22, 1949

INVENTOR.
JOHN L. HOELLERICH

BY J. D. Douglas
His atty.

Patented Sept. 18, 1951

2,568,630

UNITED STATES PATENT OFFICE 2,568,630

TUNING KNOB

John L. Hoellerich, Wilmette, Ill., assignor to Admiral Corporation, Chicago, Ill., a corporation of Delaware Application November 22, 1949, Serial No. 128,810

8 Claims. (Cl. 116—124.2)

This invention relates to tuning controls, and more particularly to a pair of concentric knobs peculiarly adapted to the tuning of a wide band tuner such as is necessary for use in a television set.

The most common type of tuner used in present day receiving sets is of the type wherein a turret is rotated to select certain coil combinations which are tuned to the respective channels. In general, this is done in steps corresponding to the frequency channels assigned to transmitting stations as controlled by the Federal Communications Commission. In almost every instance, however, the tuning steps cannot be set accurately enough for sharp tuning and, therefore, a fine tuning control is necessary. It is convenient to use concentric shafts for these two tuning controls, in general using the inner shaft for the coarse tuning or shifting of the turret and the outer shaft having a cable drive or operating directly some kind of variable condenser for the fine tuning.

It is customary in this type of tuner to provide a detent to hold the tuner in proper selected position and to indicate by sense of feel when it is properly set. This makes necessary the use of somewhat more force to move this section of the tuner than the fine control. It would then be desirable to use the larger knob for tuning the inner shaft since more torque would then be applied to the shaft for a given force on the knob.

In addition, since it is the turning of the central shaft which selects the individual stations, it is desirable that there be some method of indicating to which channel the device is tuned. This is more easily accomplished if the knob which controls this shaft extends beyond the other knob so that indicia may be read with reference to the wall of the cabinet.

Prior devices have either not been able to accomplish all the desired results set forth above or have been of the type in which the outer shaft is controlled by an annular knob fixed to the outer shaft and the inner shaft is controlled by a handle having a pointer of some sort extending beyond the annular knob. Furthermore, it was difficult to determine, in the prior art devices, to exactly which channel the tuner was set. This was due to a combination of things, one of the more prominent being due to the viewing angle which cause a parallax that varied with the position from which the operator viewed the marking on the tuning dial.

By my invention, I accomplish all the desired results by use of two concentric knobs of pleasant appearance, easy to manufacture and convenient to use. In addition, I provide a novel indicating means to indicate more accurately to which channel the receiver is tuned.

A more complete understanding of my invention may be gained by reference to the following figures which form a part of the specification.

Figure 1:
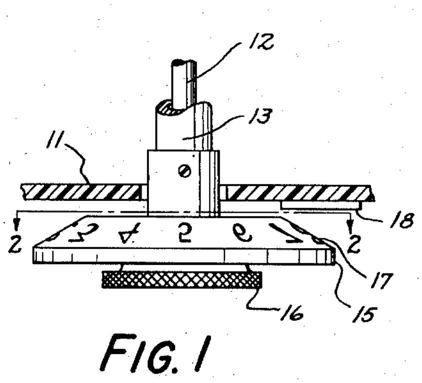
Fig. 1 is a top plan view of a simplified form of my novel indicating means, fragments of the shafts to which they are connected being shown, and the panel being shown in fragmentary view.

Briefly, my invention comprises a set of knobs for tuning a television set or the like having a tuner with concentric shafts. The inner of the shafts is turned by the outer knob which is constructed with a novel tuning indicator and the inner knob turns the outer shaft. This is accomplished by forming the outer knob with spokes between the rim and an inner hub portion which is fixed to the inner shaft. The inner knob then can be manipulated by the fingers between the spokes of the outer. A small mirror fixed to the wall of the device being tuned indicates the channel to which the coarse control is set. Although the invention about to be described will be described in connection with its use as a television tuner, it will be appreciated that my invention will be useful in connection with other types of devices, as well as radio receivers, where it is desirable to more accurately indicate the station or position to which it is set.

More specifically and referring to the drawings, my invention is described in connection with an electronic tuning device having a cabinet wall 11 and concentric shafts extending therethrough. While it is not essential, it is desirable that the inner shaft 12 control the coarse tuning and the outer shaft 13 control the fine tuning. It is also desirable, however, in the type of tuner which tunes coarsely to channels and has detent mechanism, to indicate when the coarse tuning is properly set, or specifically stated, to have some means of indicating to which channel the tuner is set. Obviously, this indication must be between the coarse tuning knob and the cabinet wall 11.

Figure 2:
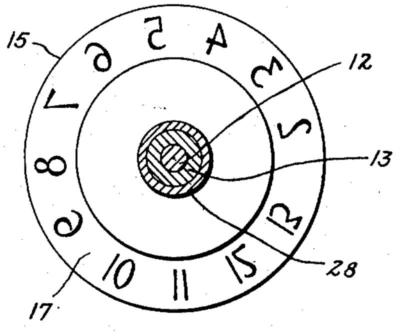
Fig. 2 is a section along line 2—2 of Fig. 1.
Figure 3:
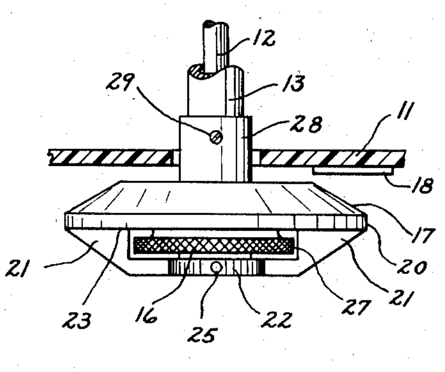
Fig. 3 is a top plan view of my concentric knob.
Figure 4:
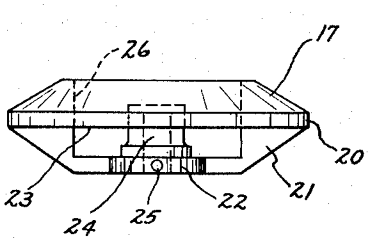
Fig. 4 is a plan view of the outer knob separated from its surroundings.
Figure 5:
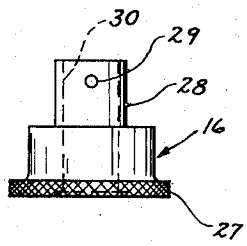
Fig. 5 is a view similar to Fig. 4 of the inner knob.
Figure 6:
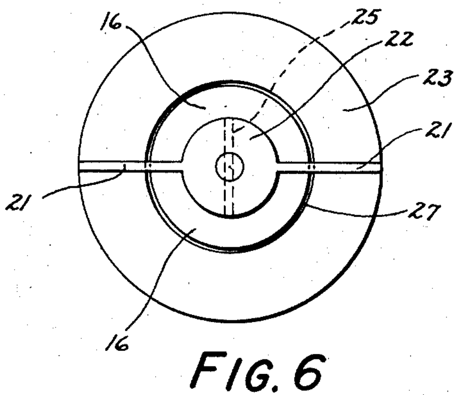
Fig. 6 is a front elevational view of my knobs assembled.

Therefore, for simplification, I have shown in Figs. 1 and 2 an outer knob 15 which controls the outer shaft 13 and an inner knob 16 controlling the inner shaft 12. The outer knob is formed with a wide chamfered surface 17 bearing indicia corresponding to the frequency channel members which may be tuned. A small mirror or reflecting surface 18 is fixed to the front of the cabinet wall 11 in a position to reflect only a single number from the chamfered surface 17 at any adjusted position of the outer knob 15. The numbers (or any other indicia used) on the surface 17, of course, are printed as "mirror images" on the surface 17 and are therefore reflected in their proper form by the mirror 18.

Thus, the mirror 18 serves as an indicator by reflecting only the number of the channel then tuned. Since the other numbers are on the chamfered surface 17 facing the cabinet 11, the one being reflected is the only number readily visible to the operator of the set, and therefore it will be apparent to him to which channel the set is tuned. Because he must view the same from a certain angle in order to see it at all, it largely eliminates the error commonly due to parallax.

In order to make this system practical for the usual type turret tuner in which the center shaft controls the coarse tuning, I have inverted the device as shown in Figs. 3–6. This device is similar to that previously described except that the outer knob 20 is adapted to turn the inner shaft. This result is accomplished by providing spokes 21 which hold a hub means 22 spaced axially from the front face 23 of the knob. This hub 22 carries a sleeve 24 which fits smoothly over the inner shaft 12 and the outer surface of which provides a bearing for the inner knob 16. A pin 25 through the hub 22 and shaft 12 fastens the knob to the shaft. A central opening 26 is provided in the outer knob large enough to receive the inner knob 16.

The inner knob 16 is provided with a knurled rim 27 somewhat larger than the hub 22. A stepped down section 28 extends through the wall 11 and embraces the outer shaft 13. A set screw 29 threaded into the stepped down portion 28 holds the outer shaft 13 in firm contact with the bore 30 of the inner knob. This knob gets additional support because of the sleeve 24 which preferably has the same outer diameter as the outer shaft 13. Thus, the inner knob 16 may be supported throughout its entire length.

To assemble the device, the inner knob 16 is placed on the sleeve 24 being inserted through the opening 26 in the outer knob. The two knobs are then together placed onto the shafts 12 and 13 and are fixed in place. It is obvious that the pin 25 could be replaced with a set screw if desired. If the device is then assembled properly, the outer knob 20 will turn the inner shaft 12 and the inner knob 16, whose knurled edge extends into the space between the hub 22 and the front surface 23 of the other knob, controls the outer shaft. This inner knob may readily be turned by the fingers grasping the rim 27 between the spokes 21. It is obvious that any number of spokes may be used. I prefer to use two because a fairly wide space is left for the operator's fingers to turn the inner knob 16 and at the same time the hub is firmly supported.

Having thus described my invention, I am aware that numerous and extensive departures may be made therefrom without departing from the spirit or scope therefrom.

I claim:

1. Tuning apparatus for a television receiver set comprising a tuning knob having a chamfered face toward said television set, said face having indicia corresponding to television frequency channels, and a mirror on said set adapted to reflect the particular indicia corresponding to the channel tuned and shaft means in connection with said set to support said knob in place.

2. Tuning apparatus for a wide band electronic tuner having a cabinet comprising a pair of concentric knobs, one of said knobs having a chamfered face toward said cabinet bearing indicia corresponding to the frequency channels to which the tuner would respond, said tuner having a pair of shafts, said knobs being connected to said shafts, said first named knob adapted to tune said tuner approximately to the assigned frequency, the other of said knobs adapted to operate a fine adjustment of said tuner, and a mirror on said cabinet opposite said chamfered face adapted to reflect the indicia of the particular channel to which the tuner is tuned.

3. Tuning apparatus for an electronic tuner having concentric inner and outer shafts comprising an outer knob having a hub member fixed to the inner of said shafts, and an inner knob having a hub member fastened to the outer of said shafts.

4. Tuning apparatus, for an electronic tuner having concentric inner and outer shafts, comprising a pair of concentric knobs, the outer of said knobs having a hub portion fixed to said inner shaft, at least one spoke extending from said hub and a rim portion connected to said spoke adapted to be grasped for tuning, the inner of said knobs fixed on the outer of said shafts and having an inner rim portion adapted to be reached between the rim portion and hub of said outer knob.

5. Tuning apparatus for an electronic tuner having concentric inner and outer shafts comprising concentric knob means including an outer knob having a hub means fixed to the inner of said shafts, spoke means extending from said hub means, rim means supported by said spoke means in axially spaced relationship, and an inner knob having a hub fixed to said outer shaft and a rim carried by said hub and extending into an opening between the hub means and rim means of said outer knob.

6. Tuning apparatus for an electronic tuner having concentric inner and outer shafts comprising concentric knob means including an outer knob having a hub fixed to said inner shafts, said hub having an extension axially of said shafts, spoke means extending from said hub, rim means carried by said spoke means, and an inner knob rotatably journalled on said sub extension and having hub means fixed to said outer shaft and an inner rim adapted to be moved by the operator's fingers between said spoke means.

7. In an electronic tuner having a cabinet, and concentric shafts from said tuner extending through the wall of said cabinet, concentric knob means for manual control of said tuner comprising an outer coarse control knob having a hub fixed to the inner of said shafts, spoke means extending from said hub, rim means carried by said spoke means, a face on said rim means chamfered toward said cabinet and bearing indicia thereon, a mirror on said cabinet in position to reflect a single indicia at one time, said rim means being formed to provide a central opening therein, and an inner fine control knob disposed within said central opening and having a hub fixed to said outer shaft and rim means carried by said hub adapted to be rotated by the operator's fingers between said spoke means.

8. A tuning device for a television receiver comprising a tuning knob having a chamfered face toward said receiver and an outer surface adapted to be grasped by an operator to turn said knob, said face being imprinted with indicia thereon corresponding to television frequency channels, and a mirror fixed to the wall of said receiver adjacent said chamfered face, said mirror being of such limited size as to reflect only one unit of the indicia at one time and being located on said wall in position to reflect that particular unit corresponding to the channel to which the receiver is tuned.

JOHN L. HOELLERICH.

REFERENCES CITED

The following references are of record in the file of this patent:

UNITED STATES PATENTS

| Number | Name | Date |
|---|---|---|
| 934,694 | Seibert | Sept. 21, 1909 |
| 1,508,465 | McGhan | Sept. 16, 1924 |
| 1,622,783 | Heyman | Mar. 29, 1927 |
| 1,882,584 | Hayden | Oct. 11, 1932 |
| 2,067,871 | Booth | Jan. 12, 1937 |

FOREIGN PATENTS

| Number | Country | Date |
|---|---|---|
| 440,607 | Great Britain | Jan. 2, 1936 |
| 475,121 | Great Britain | Nov. 15, 1937 |